(12) United States Patent
Siniaguine et al.

(10) Patent No.: US 6,402,843 B1
(45) Date of Patent: Jun. 11, 2002

(54) NON-CONTACT WORKPIECE HOLDER

(75) Inventors: Oleg Siniaguine; Sergey Savastiouk, both of San Jose; Alex Berger, Palo Alto; Igor Bagriy, Sunnyvale, all of CA (US)

(73) Assignee: TruSi Technologies, LLC, Sunnyvale, CA (US)

( * ) Notice: Subject to any disclaimer, the term of this patent is extended or adjusted under 35 U.S.C. 154(b) by 0 days.

(21) Appl. No.: 09/456,135

(22) Filed: Dec. 7, 1999

(51) Int. Cl.⁷ .............................. C23C 16/00; B66C 1/02
(52) U.S. Cl. ...................... 118/500; 118/728; 156/345; 269/21
(58) Field of Search ........................... 156/345; 269/21; 118/500, 728

(56) References Cited

U.S. PATENT DOCUMENTS

| | | | | |
|---|---|---|---|---|
| 3,523,706 A | * | 8/1970 | Logue ........................... | 294/64 |
| 3,594,609 A | | 7/1971 | Vas et al. ..................... | 315/111 |
| 3,639,831 A | | 2/1972 | Cushman ...................... | 324/33 |
| 3,743,781 A | | 7/1973 | Holden ......................... | 219/38 |
| 3,798,408 A | | 3/1974 | Foex et al. ................... | 219/121 |
| 3,818,174 A | | 6/1974 | Camacho ...................... | 219/121 |
| 3,828,162 A | | 8/1974 | Holden ......................... | 219/383 |
| 3,980,467 A | | 9/1976 | Camacho et al. .............. | 75/10 |
| 4,257,637 A | * | 3/1981 | Hassan et al. ............. | 294/64 B |
| 4,382,099 A | | 5/1983 | Legge et al. .................. | 427/34 |
| 4,420,346 A | | 12/1983 | Belkin et al. .................. | 148/4 |
| 4,517,495 A | | 5/1985 | Piepmeier .............. | 315/111.21 |
| 4,735,449 A | * | 4/1988 | Kuma ........................ | 294/64.3 |
| 5,041,713 A | | 8/1991 | Weidman ............... | 129/121.51 |
| 5,067,762 A | * | 11/1991 | Akashi ....................... | 294/64.3 |
| 5,080,549 A | * | 1/1992 | Goodwin et al. ......... | 414/744.8 |
| 5,560,779 A | | 10/1996 | Knowles et al. ............. | 118/723 |
| 5,562,841 A | | 10/1996 | Kulik et al. ........... | 219/121.59 |
| 5,609,777 A | | 3/1997 | Apunevich et al. .... | 219/121.48 |
| 5,719,370 A | | 2/1998 | Appunevich et al. .. | 219/121.49 |
| 5,782,952 A | | 7/1998 | Diaz et al. .................. | 75/10.19 |
| 5,895,558 A | | 4/1999 | Spence ........................ | 204/164 |
| 6,203,661 B1 | * | 3/2001 | Siniaguine et al. ......... | 156/345 |

FOREIGN PATENT DOCUMENTS

| | | | |
|---|---|---|---|
| SU | 677867 | * | 8/1977 |
| WO | WO 97/45862 | * | 12/1997 |

* cited by examiner

Primary Examiner—Jeffrie R. Lund
(74) Attorney, Agent, or Firm—Skjerven Morrill MacPherson LLP; G. Wolken, Jr.

(57) ABSTRACT

The present invention relates to a non-contact holder for substantially planar workpieces, particularly suited for holding thin workpieces without substantial distortion. The present invention includes a cylindrical chuck having a gas inlet orifice positioned at an oblique. The introduction of pressurized gas creates a vortex and vacuum attraction holding a wafer in close proximity to the chuck while the gas exiting from the chuck prevents contact between wafer and chuck. Small diameter chucks located in close proximity help the present invention avoid distortion when processing very thin workpieces. The gas exiting from the chuck of the present invention exits preferentially in a certain angular direction. Chucks are arranged on the wafer holder such that exiting gas is preferentially directed radially towards the periphery of the holder and that exiting gas is directed between adjacent chucks, not directly at another nearby chuck. Chucks on the periphery of the holder are positioned have the gas exiting therefrom towards the periphery of the holder and overlapping the gas flow from immediately adjacent chucks. Chucks on the periphery of the holder are located as close together as feasible. The combination of overlapping gas flow and close proximity creates a gas shield on the boundary of the wafer holder.

13 Claims, 9 Drawing Sheets

NON-CONTACT WORKPIECE HOLDER

BACKGROUND OF THE INVENTION

1. Technical Field

The present invention relates to the processing of planar substrates and more particularly relates to holders for substantially planar workpieces, providing non-contact support for typically thin, flexible workpieces without incurring substantial distortion of the workpiece or risk of fracture.

2. Description of Related Art

Numerous areas of technology require that a workpiece be held in position while processes are performed thereon. In particular, the processing of semiconductor wafers into integrated circuits requires the wafer to be held by a suitable holder without impeding the processing steps directed to the exposed flat surface of the wafer. Following production of the integrated circuits, wafer processing is generally not finished. In particular, many areas of technology (cell phones, smart cards and the like) require that the integrated circuit providing the internal intelligence for the device be very thin. It is typically inconvenient to fabricate the integrated circuits directly on a thin wafer as distortion, non-uniform processing, perhaps even rupture, may occur during the numerous processing steps typically required for integrated circuit fabrication. Therefore, it is common practice for a wafer containing numerous fully fabricated integrated circuits thereon (on the "face" side of the wafer) to be thinned by means of etching from the reverse side ("back side") of the wafer. Plasma etching is a typical method for wafer thinning. For economy of language we will refer to the "back side" of the wafer and intend thereby the face undergoing (or destined to undergo) thinning by etching. The "face" of the wafer denotes the face of the wafer not undergoing etching, typically having the integrated circuits thereon and lying in close proximity to the wafer holder.

To be definite in our description of the invention, we will describe the common instance of the processing of semiconductor wafers as may typically occur in the production of integrated circuits or in wafer post-processing for thinning, etc. However, the processing of any flexible planar workpiece in a non-contact holder is also a potential area of application for the present invention. Substrates for flat panel displays, printed wire boards, various films (possibly having layered structures), construction materials such as plywood, paneling and the like may require processing while held in a suitable holder. Other rectangular, circular, star-shaped or irregularly shaped planar workpieces may require processing by means of a non-contact holder. Such workpieces may be relatively large (perhaps 10 meters across). In addition, such workpieces may be flexible, readily subject to distortion or damage in the holder. The present invention provides non-contact support for such objects while avoiding unacceptable distortion. To be definite in our description, we will discuss the commercially important processing of the back side of semiconductor wafers. However, generalizations to other workpieces requiring non-contact support without substantial distortion will be obvious generalizations of the present invention.

Since semiconductor wafers are expected to be an important area of application for the present invention, we will describe the primary features of the present invention in terms of semiconductor processing, not intending to limit the invention to this particular choice or particular example. Semiconductor wafers aptly illustrate the features of the present invention and permit obvious modification for use in processing other flexible workpieces.

Several challenges must be met for successful wafer thinning. The wafer is (or soon becomes) very thin, rendering it susceptible to distortion. Distortion would generally lead to non-uniform etching, non-uniform heating of the wafer (as during plasma etching, for example) and potential damage to the integrated circuits lying on the face of the wafer opposite from the back side being etched. Thus, an important challenge to be met by a wafer holder is the ability to hold thin, easily distorted wafers in a flat position during etch. Of course, the wafer holder must not contact the exposed integrated circuits lying on the face of the wafer nearer the wafer holder. Thus, non-contact support for a flexible wafer must be provided.

Another challenge to be met by the wafer holder relates to preventing debris from the plasma etch (for example) from contaminating the integrated circuits on the face of the wafer. More stringently, the wafer holder should also prevent debris from impacting the thin edge of the wafer. Non-contact support invariably implies a gap between the wafer and the holder. Etching debris clearly need to be kept out of this gap. Preferably, the etching debris should also be kept from the wafer edge. While not as serious a problem as debris contacting the opposite face of the wafer, edge contamination may lead to rejection of the particular integrated circuits lying on the contaminated regions of the edge. Thus, integrated circuit yield would be reduced.

The floating of a wafer above a layer of compressed gas is described in the work of Pirker (U.S. Pat. No. 5,896,877). The wafer is held in position by gravity while the air cushion prevents contact with the wafer holder.

Siniaguine and Steinberg (PCT International Publication No. WO/97/45862, hereinafter "'45862") describe a non-contact holder for wafer-like objects in which a vortex of rotating air provides both the vacuum support for the wafer while providing the air cushion insuring non-contact with the wafer holder. The present invention makes use of a vortex-created partial vacuum to provide both wafer support and an air cushion insuring non-contact, including several improvements to the technology of '45826 as described in detail below.

BRIEF SUMMARY OF THE INVENTION

The present invention relates to a non-contact holder for flexible workpieces, particularly suited for holding thin workpieces such as semiconductor wafers without substantial distortion. One feature of the present invention is a cylindrical chuck having a gas inlet orifice therein positioned at an oblique location with respect to the central axis. The introduction of pressurized gas through this orifice leads to the creation of a vortex within the chuck. The vortex creates vacuum attraction to hold a wafer in close proximity to the chuck while the gas exiting from the chuck prevents contact between wafer and chuck. Small diameter chucks located close together help the present invention avoid distortion or fracture when holding very thin wafers for processing.

In addition, the chucks of the present invention cause the gas exiting therefrom to exit preferentially in a certain angular direction. Chucks are positioned in a non-contact wafer holder pursuant to the present invention so as to reduce or avoid high pressure zones due to build up of gas exiting from each chuck. Such local regions of higher pressure tend to distort wafers away from the plane of the holder, resulting in non-uniform etching or fracture of the wafer. In particular, the chucks of the present invention are arranged on the wafer holder such that exiting gas is preferentially directed radially towards the periphery of the holder. Furthermore, chucks are preferably arranged such that gas exiting from a typical chuck is directed between adjacent chucks, not directly at another nearby chuck. Chucks on the periphery of the holder are preferably positioned so as to have the gas exiting therefrom directed towards the periphery of the holder and overlapping the gas flow from immediately adjacent chucks. In addition, chucks on the periphery of the holder are preferably located as close together as feasible. The combination of overlapping gas flow and close proximity tends to create a gas shield on the boundary of the wafer holder, increasing edge protection for the wafer.

One embodiment of the present invention has all chucks supplied from a common gas supply, conveniently a reservoir to which all chucks are connected. Increased gas flow on the periphery of the wafer holder can be achieved by making use of larger diameter gas inlet orifices for such peripheral chucks. Smaller diameter gas inlet orifices for non-peripheral chucks tends to increase the vacuum attraction for such chucks. This differing gas flow for different chucks is desirable for providing protective gas flow on the periphery of the wafer holder and increased vacuum attraction near the center of the wafer holder. Large workpieces may be processed by means of the holder of the present invention, including rectangular, star-shaped or irregularly shaped workpieces.

BRIEF DESCRIPTION OF THE SEVERAL VIEWS OF THE INVENTION

The drawings are not to scale.

FIG. 6A: Schematic cross sectional view of chuck and wafer on periphery of wafer holder.

DETAILED DESCRIPTION OF THE INVENTION

In the following description and figures, similar reference numbers are used to identify similar elements.

The present invention provides a non-contact holder for flexible workpieces by a combination of vacuum attraction and vapor cushion. The vacuum attraction draws the wafer into close proximity to the holder in a direction perpendicular to the holder. The force of attraction between the wafer and holder created by vacuum according to the present invention typically is much larger than the force of gravity on the wafer due to its weight. The wafer is typically supported from above by means of the vacuum attraction while permitting the lower wafer face to be exposed for plasma etching. This wafer orientation offers the advantage over the Pirker design cited above in that gravity tends to pull etching debris away from the wafer rather than keeping such debris close to the wafer.

The present non-contact holder has another advantage over the Pirker design in that the force holding the wafer in the Pirker holder is limited to be no larger than the weight of the wafer. The force attracting the wafer to the holder in the present invention is limited only by the pressure difference between the vortex-created partial vacuum and the surrounding atmosphere multiplied by the surface area of the wafer. This attraction, $\Delta P \times$Surface Area, typically greatly exceeds the weight of the wafer.

Note, however, that non-contact wafer holders typically provide very small forces for restraining the motion of the wafer parallel to the plane of the holder. That is, there is virtually no lateral frictional force provided by an air cushion. Thus, the present invention typically supports the wafer from above relying on other means to hold the wafer in lateral position with respect to the holder. One common means of lateral positioning is to rotate a carousel comprising several wafer holders, generating centrifugal forces holding each wafer snugly against limiting pins on the outer periphery of the carousel.

The present invention has a further advantage of being particularly suited for the uniform support of thin, flexible wafers, leading to uniform etching of the exposed wafer back side. Each vacuum chuck of the present invention is designed to provide non-contact vacuum support for wafer-like objects. Each chuck is farther designed to possess certain gas flow and vacuum properties that, when arrayed in a wafer holder pursuant to the techniques of the present invention, provide several additional advantages of support and stability. Among the advantages provided by the configuration in the wafer holder of the chucks of the present invention are the following: a) Uniform support for extremely thin wafers without significant distortion. b) Uniform non-contact support for thin wafers having bumps or other non-uniform surface features on the side of the wafer nearer the wafer holder. c) Uniform cooling of the wafer. d) Protection of the edge of the wafer from etching and from the debris of etching. The special features of the chuck according to the present invention are conveniently described first and the advantages such features bring to the art of non-contact support for wafer-like objects. Then it is convenient to describe additional advantages such chucks bring to the art when arrayed into a wafer holder according to the present invention.

Figure 1:
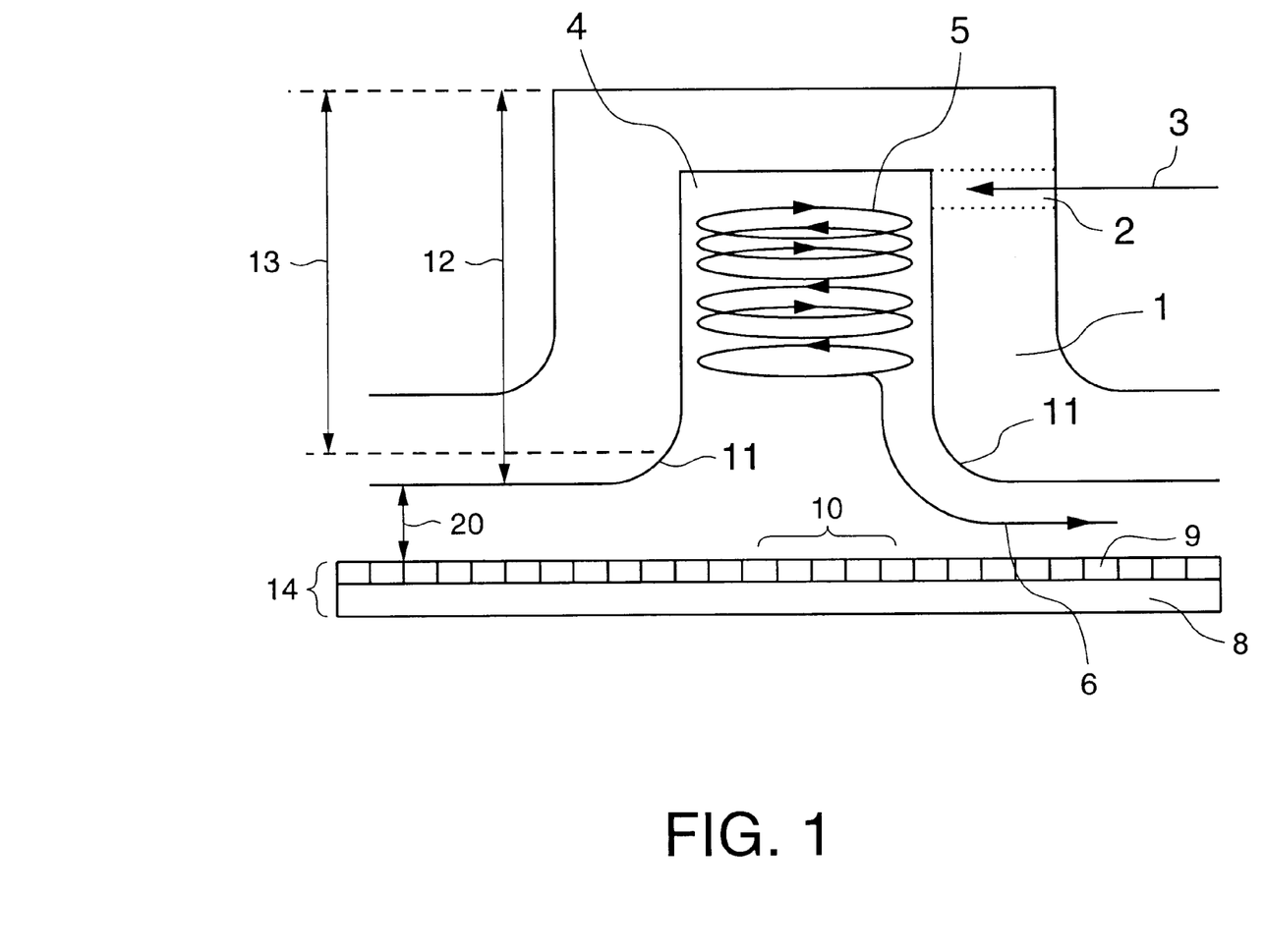
FIG. 1: Schematic cross sectional side view of chuck, vortex and wafer.

FIG. 1 depicts in schematic cross section (not to scale) an individual wafer-holding chuck according to one embodiment of the present invention. A complete wafer holder according to the present invention consists of a plurality of such chucks configured to provide appropriate support for flexible wafers and other advances in the art noted elsewhere herein. Advantages of the present invention derive both from the structure of each chuck and from the structure and arrangement of such chucks into an array comprising the wafer holder.

Wafer holders of the prior art have several disadvantages when very thin wafers are being processed. Typical prior art holders may introduce distortion and non-uniformities in the etching process for wafer less than about 300 microns ($300 \times 10^{-6}$ meter) in thickness. In contrast, the wafer holder of the present invention is designed to process extremely thin workpieces (for example, about 5 microns in thickness) without substantial distortion of the wafer and the associated risks of non-uniformities in the etching process or fracture of the wafer.

Typically, prior art wafer holders similar to those disclosed in '45862 would have a diameter sufficiently large that the central portion of a thin wafer would tend to be sucked into the vacuum vortex. This tends to occur for chuck diameters greater than about 6 mm. In contrast, the wafer holder of the present invention makes use of small diameter chucks, typically 2.5 to 3 mm., thereby eliminating vacuum attraction distortion for even very thin wafers.

Prior art configuration of chucks in vortex, non-contact wafer holders as described in '45862 lead to another type of wafer distortion in addition to vacuum attraction distortion. As gas exits from adjacent chucks, regions of slightly higher pressure tend to develop between the chucks. This pressure can be sufficiently elevated over ambient that, for very thin wafers, distortion of the wafer may occur in the direction away from the wafer holder. Thus, alternating regions of attraction (in the center of the chuck) and repulsion (between chucks) may both affect the shape of the wafer. This leads to "S" shaped distortion of the wafer, increased non-uniformities in processing, and the potential for wafer rupture. One method to combat this problem, pursuant to the present invention, is to make use of numerous smaller chucks placed close together. The spacing between chucks of the present invention is typically less than 20 mm center-to-center, 28 in FIG. 1A. The chucks of the present invention are also designed to have gas exit from each chuck preferentially in a limited angular spread. The chucks are arranged in the face of the wafer holder such that the limited angular spread in the gas exiting from each chuck is directed so as to reduce or eliminate the inter-chuck regions of elevated pressure. Thus, a first embodiment of the present invention, particularly suited to handling very thin wafers, is to utilize numerous small diameter chucks positioned in close proximity to each other.

Figure 1A:
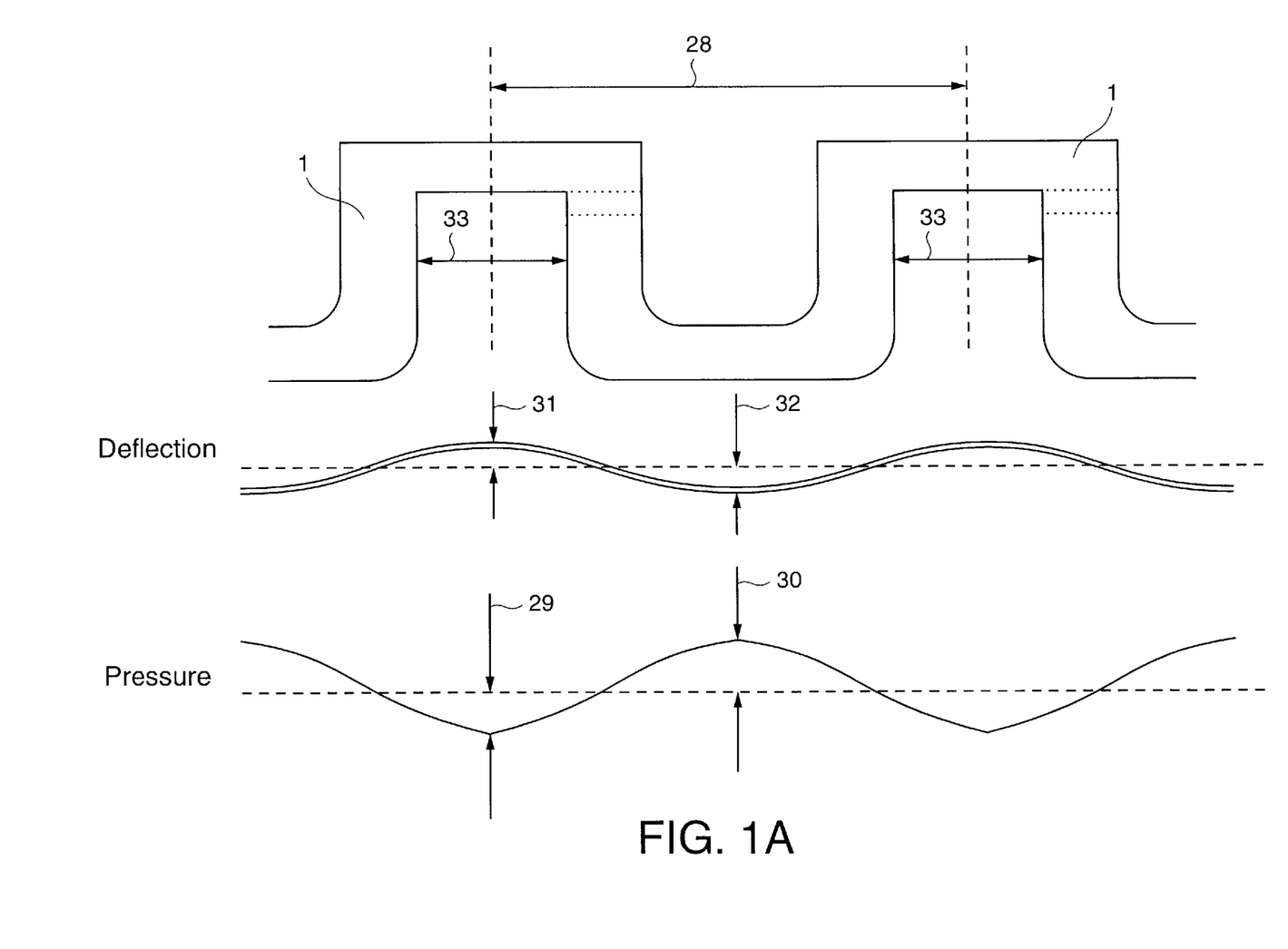
FIG. 1A: Schematic cross sectional side view of adjacent chucks including typical pressure profile and possible wafer distortions resulting therefrom.

FIG. 1A depicts two adjacent vortex chucks, 1, separated by distance 28, as would typically be present in a wafer holder of the present invention. The vortex created in each chuck causes a local region of low pressure beneath each chuck, 29, that attracts the wafer to the wafer holder. However, the exit of gas from the chuck may also lead to regions of elevated pressure between the chucks, depicted as 30 in FIG. 1A. These regions of adjacent high and low pressure may lead to distortion of the wafer, depicted as 31 and 32. Distortion of the wafer, 31 and 32, may lead to nonuniform etching or fracture of the wafer. Thus, while the chucks of the present invention offer improvements and advantages over the prior art, the configuration of the chucks into a holder must also be done so as to avoid or reduce the pressure differences and wafer distortion depicted in FIG. 1A One important application of the present invention is the support of thin wafers that are particularly subject to distortion during processing. Typically such wafers would have a thickness less than approximately 300 $\mu$m (micrometers or microns), often less than about 150 $\mu$m, and can be as thin as approximately 5 $\mu$m. Initially thick wafers may be supported in a holder of the present invention for the purpose of thinning. Thus, the capability of the present holder to support thin wafers adequately and without damage could permit process engineers to fabricate thinner wafers than heretofore, advancing thereby the state of the art in wafer fabrication. For example, to support adequately and without significant distortion silicon wafers having a thickness greater than about 500 microns, a chuck diameter, 33, less than about 10 mm is satisfactory. For silicon wafers less than about 100 microns thick, chuck diameters less than about 6 mm are required.

Figure 2:
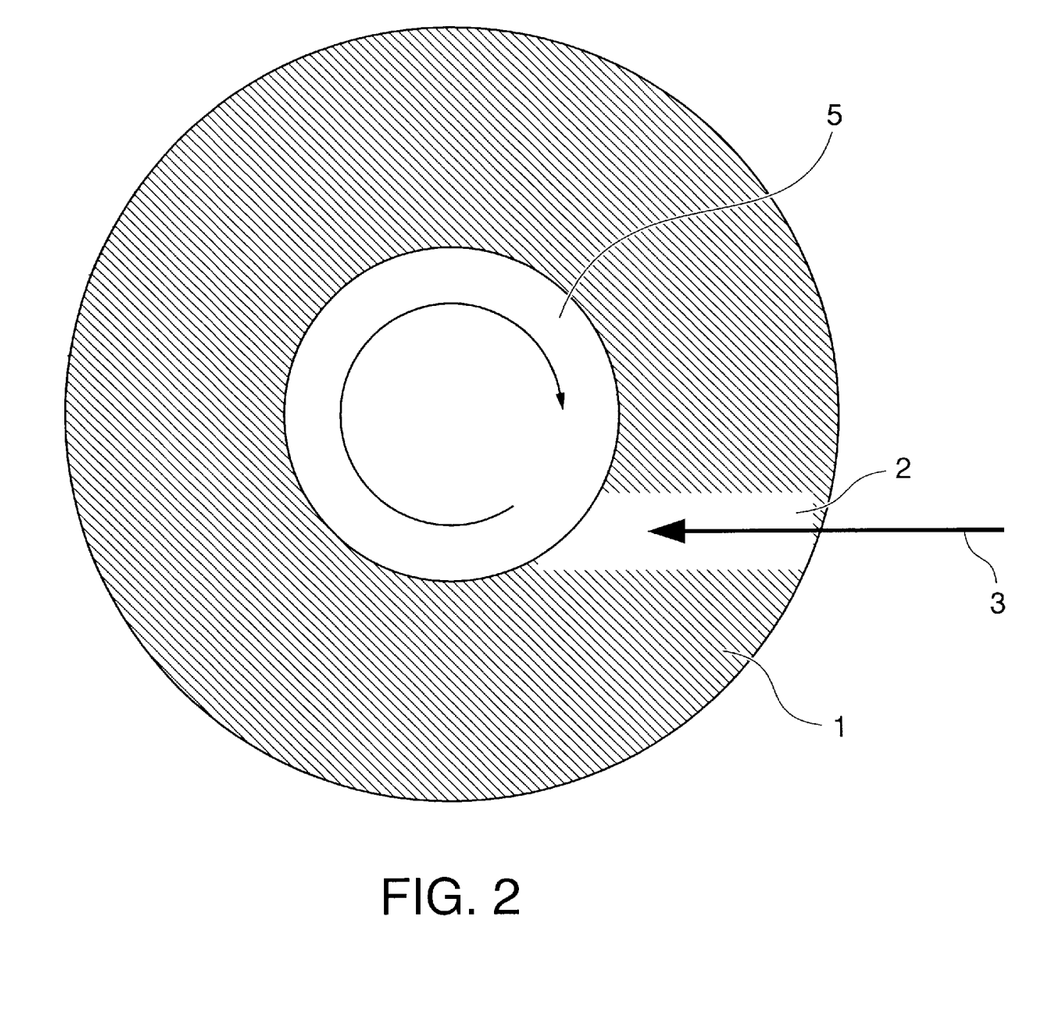
FIG. 2: Schematic top view of chuck, vortex and gas inlet orifice.

The chuck of the present invention, as depicted in cross sectional side view in FIG. 1, consists of a solid encasement, 1, surrounding a vortex chamber, 4 (typically cylindrical). A relatively small gas inlet orifice, 2, connects vortex chamber, 4, with the region external to the chuck. Typically, gas inlet orifice 2 will have diameter in the range of 0.25–0.50 mm. Orifice, 2, is directed substantially perpendicular to the central axis of vortex chamber, 4, but offset from the exact radial direction. FIG. 2 depicts the configuration of vortex chamber, 4, encasement, 1, and orifice, 2, in top view showing the offset orientation of orifice 2.

FIG. 1 depicts the non-contact support provided by the chuck of the present invention. A wafer, 8, is depicted with fabricated structures, 9, on the face nearer the chuck. It is envisioned that wafer, 8, will typically be a semiconductor wafer having integrated circuits thereon, 9. However, this is by way of illustration and not limitation and the present invention may be used for non-contact support of any wafer-like object or workpiece as described in detail elsewhere herein. Thus, structure, 9, in FIG. 1 illustrates that the chuck of the present invention provides non-contact attraction for wafers having bumps or other surface non-uniformities on the face nearer the wafer holder in addition to holding wafers being substantially flat on both faces.

The vortex motion of gas, 5, creates a zone of partial vacuum above region, 10, of the wafer. This reduced pressure on the chuck side of wafer 8 is the mechanism holding wafer 8 in close proximity to the chuck. For typical operating conditions, this attractive force will greatly exceed the weight of the wafer. Thus, the present invention may hold the wafer in any convenient spatial orientation, typically suspended from above as depicted in FIG. 1 to permit etching from below and gravitational extraction of the etching debris from the region of the wafer (provided however, motion of the wafer in the plane of the holder is restrained as may be necessary in any or all orientations).

Figure 3:
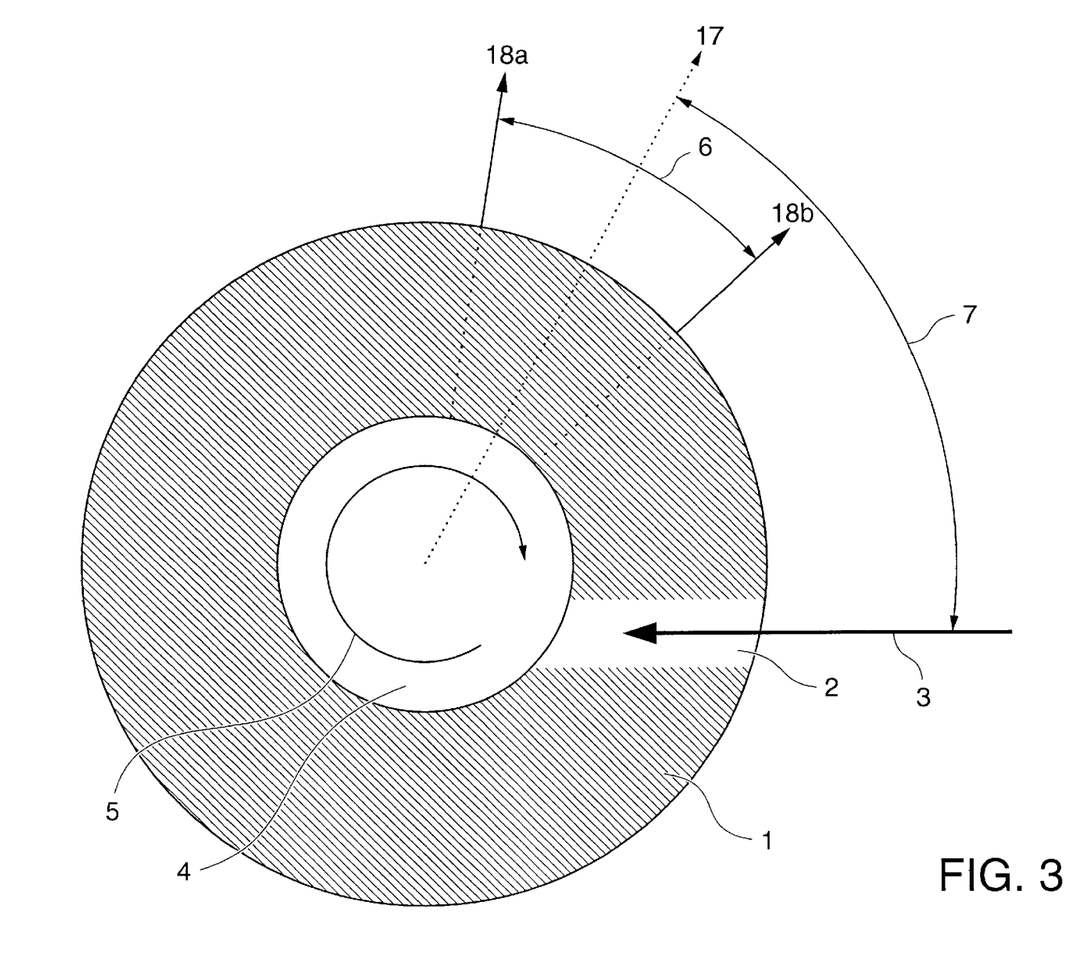
FIG. 3: Schematic top view of chuck, vortex, gas inlet orifice and depiction of preferential gas exit from chuck.

The vortex-forming gas, 5, creates the vacuum holding the wafer near the holder but also provides for non-contact between wafer and holder as the gas exits from the vortex chamber as gas, 6. It is depicted in FIG. 3 that gas, 6, exits from the vortex chamber preferentially in a definite angle with respect to the inlet orifice. However, portions of the vortex-forming gas exit from the vortex chamber from other angles as well, thus providing a vapor barrier or vapor cushion between the wafer and the holder. This combination of vacuum retention and vapor cushion is an important mode of operation of the non-contact wafer holder of the present invention.

It is important in utilizing the wafer holder of the present invention for supporting thin wafers that the diameter of vortex chamber, 4, not be too large. Too large a diameter for vortex chamber, 4, facilitates distortion of a wafer in region 10 thereof by bending into the vortex chamber, creating a mound-like distortion directed towards the low pressure region in the center of the vortex chamber. In the practice of the present invention it is preferred that the diameter of vortex chamber not exceed about 6 mm (millimeters).

Gas, 3, (typically air or nitrogen but the present invention is not inherently limited to these gases) is delivered to the vortex chamber, 4, through orifice, 2, typically under modest positive pressure. The functioning of the present wafer holder is determined in part by the pressure under which gas, 3, is delivered. Positive pressures from about 3 psi (pounds per square inch) up to about 100 psi work acceptably well in the practice of the present invention. However, gas having pressures from 5 to 30 psi is preferably used in the practice of the present invention. The direction of orifice, 2, is chosen to cause gas, 3, upon exiting from orifice, 2, into vortex chamber, 4, to undertake circulatory motion creating thereby a vortex, 5.

The partial vacuum holding the wafer to the holder is caused by the low pressure region in the center of the vortex, 5. This vacuum attraction tends to increase as the circumferential velocity of gas flow increases around the vortex, 5. Thus, in practical operation of the present invention, increasing the pressure at which gas, 3, is delivered to the vortex chamber leads to increased gas flow velocity and, hence, increased attractive force between wafer and holder. Decreasing the diameter of inlet orifice, 2, also increases the gas velocity and, hence, the vacuum force of the chuck. These methods provide convenient techniques for adjusting the force holding the wafer to the chuck. Too large an attraction will risk distortion of the wafer in region 10. Too small an attractive force may lead to inadequate adhesion of wafer and holder and the possibility of edge or face (face 9) contamination. The balance between vacuum attraction and vapor (gas) cushion leads to the wafer maintaining a separation from the wafer holder of approximately 0.13 to 0.40 mm. This separation is substantially maintained even in the instance that the wafer has bumps or other non-uniformities of structure on the side facing the wafer holder.

It is convenient in some embodiments of the present invention for different chucks in the wafer-holding array to have different vacuum attractive forces. In particular, it is often useful for the chucks on the periphery of the wafer holder to have higher gas flow volume but less attractive force. Higher gas flow volume on the periphery of the wafer holder increases protection for the wafer edge. Conversely, the chucks away from the periphery of the wafer holder may call for increased vacuum support but less volume of gas flow (to reduce the positive pressures associated with gas build-up between chucks, depicted as 30 in FIG. 1A). The use of various gas flow characteristics is most conveniently done in the present invention by fabricating the array of chucks in the wafer with larger gas inlet orifices, 2, in those chucks positioned on the periphery of the wafer holder and smaller gas inlet orifices in those chucks nearer the center of the holder. Thus, all chucks on a wafer holder may be supplied by a single gas supply at constant pressure, but the chucks on the holder periphery generate a larger volume of gas flow while interior chucks provide more vacuum attractive force.

Important in the functioning of the present invention is the exit of vortex gas, 5, from the vortex chamber, 4. FIG. 3 depicts a top, schematic view of the gas, 6, exiting from vortex chamber, 4. The vortex chamber, inlet orifice and gas conditions of the present invention are chosen to cause the gas exiting from the orifice chamber to do so with a clearly directional character, denoted by 6 in FIG. 3. The angular extent of exiting gas, 6, and the angle at which the gas preferentially exits from the vortex chamber, 7, are chosen in the present invention to cause proper wafer-holding characteristics.

The gas exiting from the chuck, as depicted in FIG. 3, has two characteristics of particular interest in the present invention; the angular spread, 6, and the central angle of gas exit. That is, the gas exiting from the vortex chamber does not exit in a uniform manner from the circumference of the vortex chamber. Rather, the exiting gas has both a preferred direction of exit, 7, (as a "jet") and a definite angular spread, 6. The directional and angular characteristics of the exiting jet depicted in FIG. 3 are used to determine the location and orientation of multiple chucks on the wafer holder, according to the present invention. Chucks intended for certain locations on the wafer holder will be have structures appropriate to those locations, pursuant to the present invention.

The exit angle for the center of the exiting gas flow, 7, is determined by several characteristics of the chuck. Angle 7 tends to increase as the diameter of inlet orifice, 2, is increased. Angle 7 also tends to increase with increasing diameter of vortex chamber, 4. Two related effects also increase exit angle 7. Exit angle 7 increases as the depth of vortex chamber, 12, increases and/or the curvature of fillets, 11, increases. Alternatively, exit angle 7 tends to increase as the depth of vortex chamber increases where such depth is measured from the top of the vortex chamber to the top of the fillet, denoted by 13 in FIG. 1.

Figure 4:
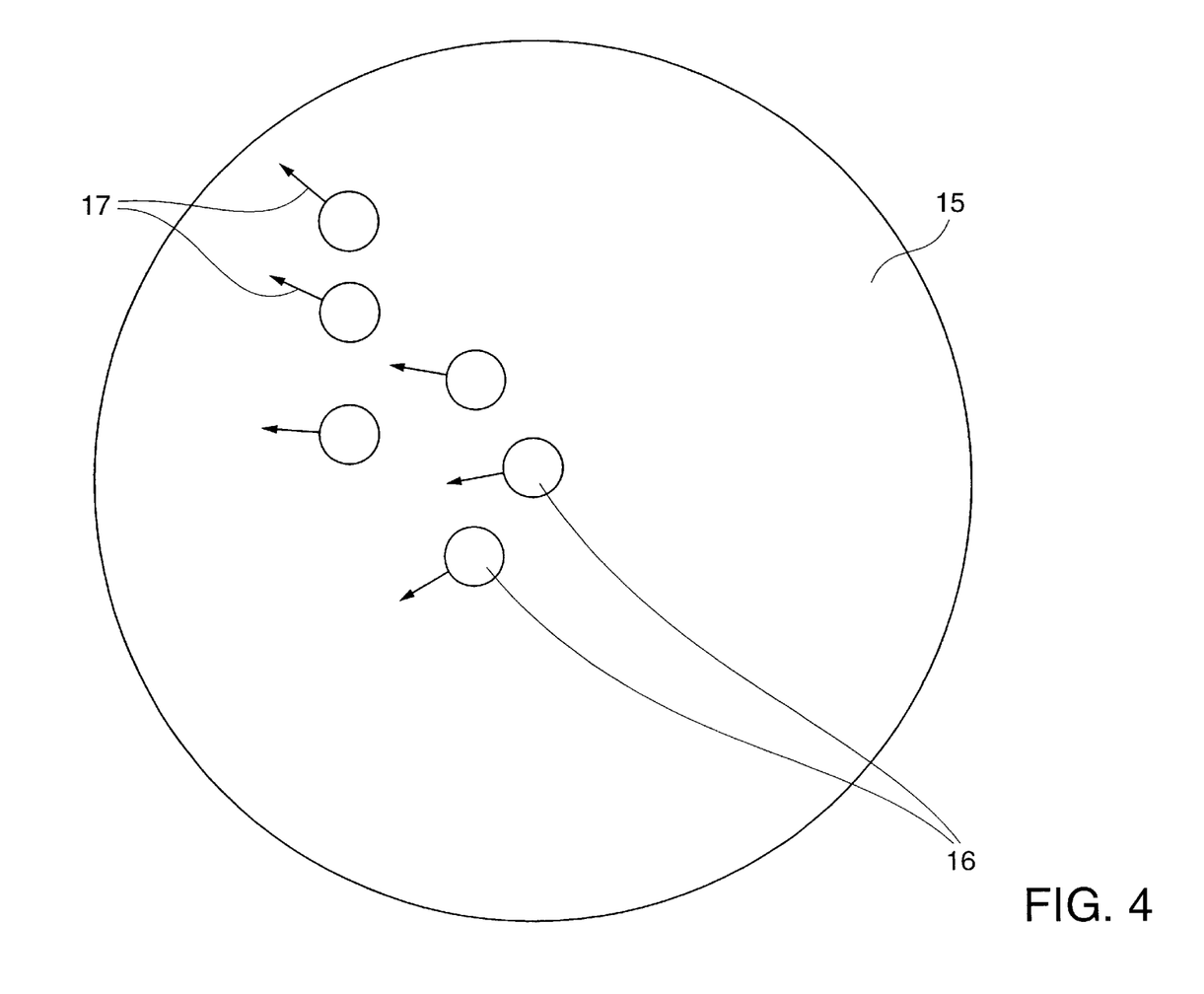
FIG. 4: Schematic depiction of arrangement of chucks on wafer holder and preferential direction of gas escape.

In addition to the structure of the chuck described herein pursuant to the present invention, the arrangement and orientation of such chucks into a full wafer holder is included within the scope of the present invention. We depict in FIG. 4 a back-side-on view (bottom view in the sense of FIG. 1) of one embodiment of the wafer holder of the present invention. Typically, the wafer holder of the present invention will consist of a substantially planar portion substantially the size and shape of the wafer to be processed, 15, in which are located a plurality of chucks, 16. The chucks may be integrally formed into the wafer holder, or fabricated separately and inserted into openings therein with proper alignment and attachments. The size, shape, orientation and arrangement of chucks in FIG. 4 is schematic only and not to scale.

Chucks on the periphery of the holder are subject to different rules of arrangement from chucks not on the periphery pursuant to the present invention. Non-peripheral chucks are depicted as 16 in FIG. 4 (not all are labeled but all depicted in FIG. 4 are intended to be non-peripheral chucks). Such non-peripheral chucks are arranged substantially uniformly across the interior of holder, 15, and in reasonably close proximity. The spacing between centers of nearest-neighbor chucks should not exceed about 38 mm. In addition, the directional flow of gas exiting from each chuck should be directed substantially radially outward from the center of the chuck holder, as depicted in FIG. 4. The arrangement of non-peripheral chucks should also be such as to direct the center of the exit gas jet (17 in FIGS. 3 and 4) to the region between nearby chucks. That is, non-peripheral chucks should be oriented according to the preferential direction of exit gas flow, towards the circumference of the wafer holder and between adjoining chucks. The arrangement of non-peripheral chucks provides adequate wafer support without distortion, taking care to direct gas jets from non-peripheral chucks in the general direction of inter-chuck gaps to avoid inter-chuck regions of high pressure sufficient to distort the wafer as depicted in FIG. 1A (30 and 32).

The arrangement of non-peripheral chucks according to the present invention provides for substantially uniform support of thin wafers and substantially uniform gas flow between wafer holder and wafer. Uniform gas flow is an important advantage of the present invention as it provides uniform cooling of the wafer during processing. Uniformity of temperature is an important advantage of the present invention especially during the high temperatures generated by typical plasma etching of wafers. A higher temperature on some local regions of the wafer leads to more rapid plasma etching rates for those regions. Thus, non-uniform temperature leads to non-uniform etching. The chucks and wafer holder of the present invention ameliorate or substantially reduce temperature variations across the wafer by provide for uniform gas cooling.

Another embodiment of the present invention makes use of temperature controlled gas, typically cooled. For very hot etching processes, particularly temperature sensitive wafer, cooling the gas may facilitate the wafer etching processes. Such control of the gas temperature is included within the scope of the present invention although for most etching process of semiconductor wafers it is envisioned that gas at ambient temperature will be acceptable.

Figure 5:
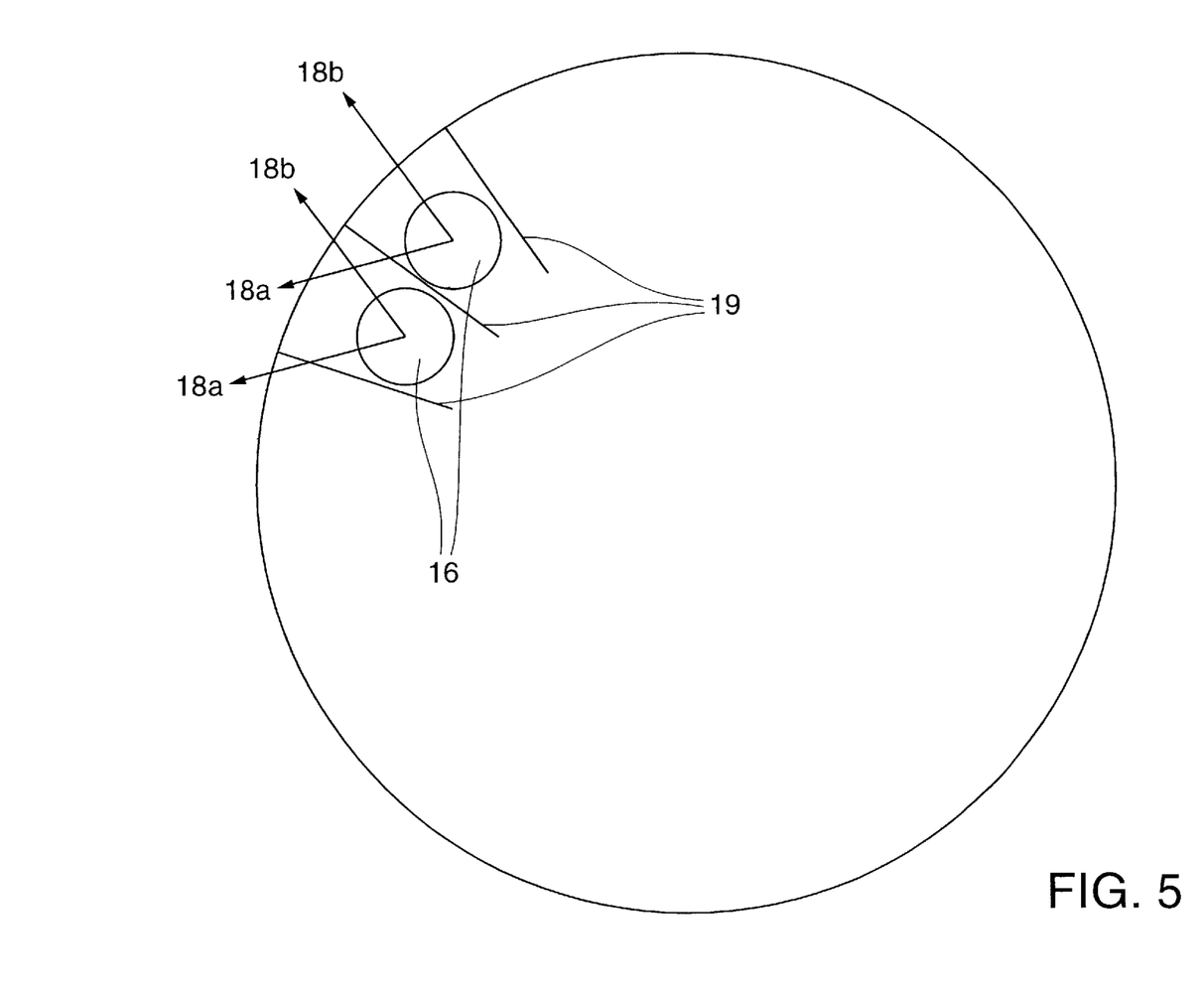
FIG. 5: Schematic depiction of arrangement of chucks on periphery of wafer holder.

FIG. 5 depicts the back-side-on bottom view of FIG. 4 demonstrating the arrangement of peripheral chucks, 16. Chucks on the periphery are preferably placed circumferentially about wafer holder with the exit gas jet directed radially outward. However, the spacing of the peripheral chucks from each other and from the edge of the wafer are preferably chosen so the exiting gas jets from adjacent chucks overlap. Thus, 18a and 18b depict the boundaries of the exiting gas jet in FIGS. 3 and 5. It is not important in the practice of the present invention that the boundary of gas jet, 6, be defined with precision. For purposes of alignment of the peripheral chucks, it is convenient to choose boundaries 18a and 18b as positions where the gas flow is about 50% of the maximum flow at the center of the jet. However, the overlap of exiting gas jets as depicted in FIG. 5 results in reasonably uniform gas flow across the edge of the wafer, 14, in FIG. 1.

FIG. 6A depicts a cantilever effect that operates along the periphery of the wafer holder, 34, tending to distort the edge region of the wafer, 35, undergoing processing. Periphery chucks denoted by 1 in FIG. 6A are preferably positioned sufficiently close to the edge of the wafer holder, 34, that the cantilever distortion of the wafer, 35, is negligible. In short, peripheral chucks should be as close as possible to the edge of the holder and permit gas jet overlap.

An important advantage of the arrangement of chucks according to the present invention is to provide protection for the wafer edge (14 in FIG. 1) during etching. The flow of exit gas from the wafer holder around the wafer's edge is an important mechanism for edge protection according to the present invention. Thus, uniform gas flow, exiting from the peripheral chucks and flowing around the edge of the wafer provides a level of edge protection. This flow is facilitated by higher gas flow from peripheral chuck, closer spacing of peripheral chucks and overlapping of exit gas jets in the edge region. Some or all of these modes of edge protection many be included within the scope of the several embodiments of the present invention.

Additionally, uniformity of gas flow over the wafer's edge may be further facilitated by the use of grooves, 19, in the wafer holder. Such grooves are directed radially inward from the edge of the wafer between peripheral chucks. Typically the grooves would be approximately 0.08 to 0.25 mm deep, approximately 0.25 mm to 1.00 mm wide.

Figure 6:
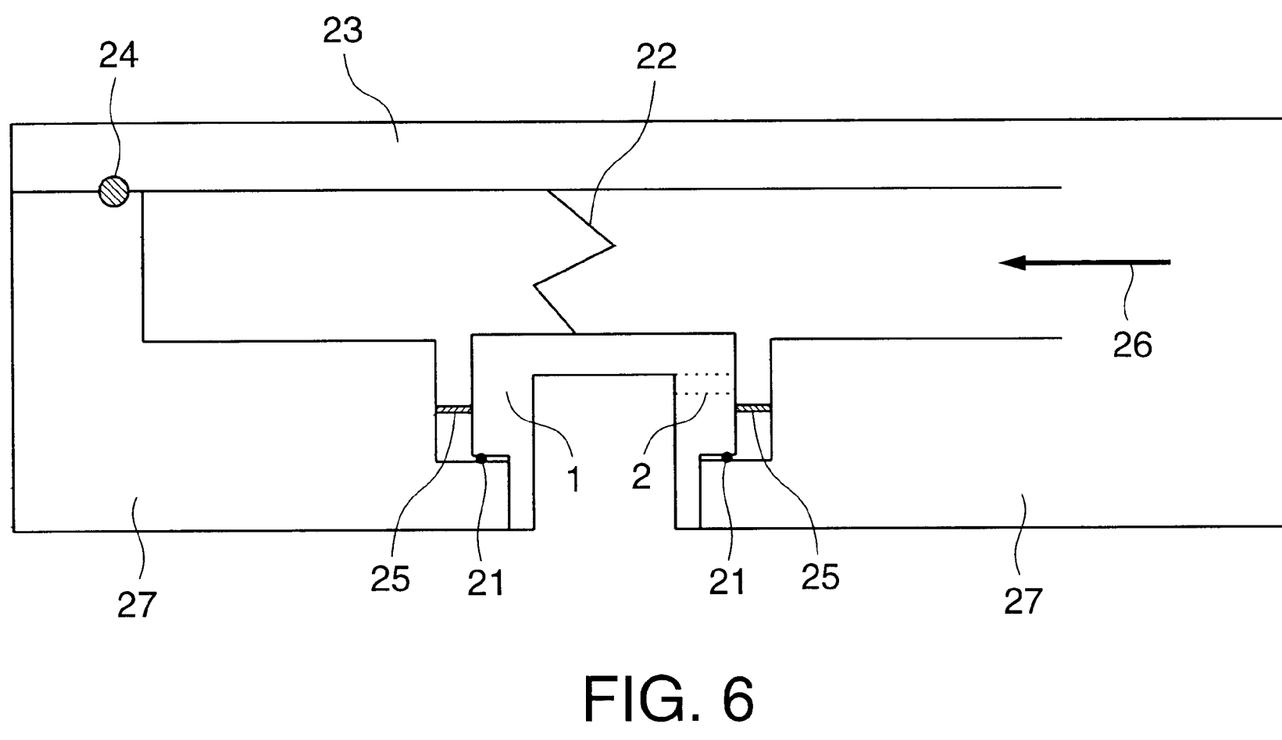
FIG. 6: Schematic cross sectional view of chuck mounted in wafer holder.

FIG. 6 depicts the mode for mounting a chuck in the wafer holder. One chuck is depicted in FIG. 6 (not to scale). Numerous chucks are mounted into the wafer holder as noted previously herein, each typically mounted according to FIG. 6.

FIG. 6 depicts chuck, 1, containing gas inlet, 2, mounted in the wafer holder, 27. Chuck, 1, would typically be separated from wafer holder, 27, by means of O-rings, 21 making a substantially gas-tight seal between chuck and wafer holder. O-rings, 21 are to insure that all gas exiting through the chuck is by means of gas inlet, 2. Typically, chuck, 1, would be held tightly against wafer holder, 27, by means of force from a spring, 22 or similar device. Gas, 26, typically air enters the space above and around all chucks, to exit by means of channel 2 creating the vortex and non-contact holder as described elsewhere herein. A separate top portion, 23, may be preferably used in the practice of the present invention, separated from wafer holder 27 by means of at least one O-ring, 24, creating a substantially gas tight seal between 23 and 27. Optionally, registration pin 25 can be included.

Figure 7:
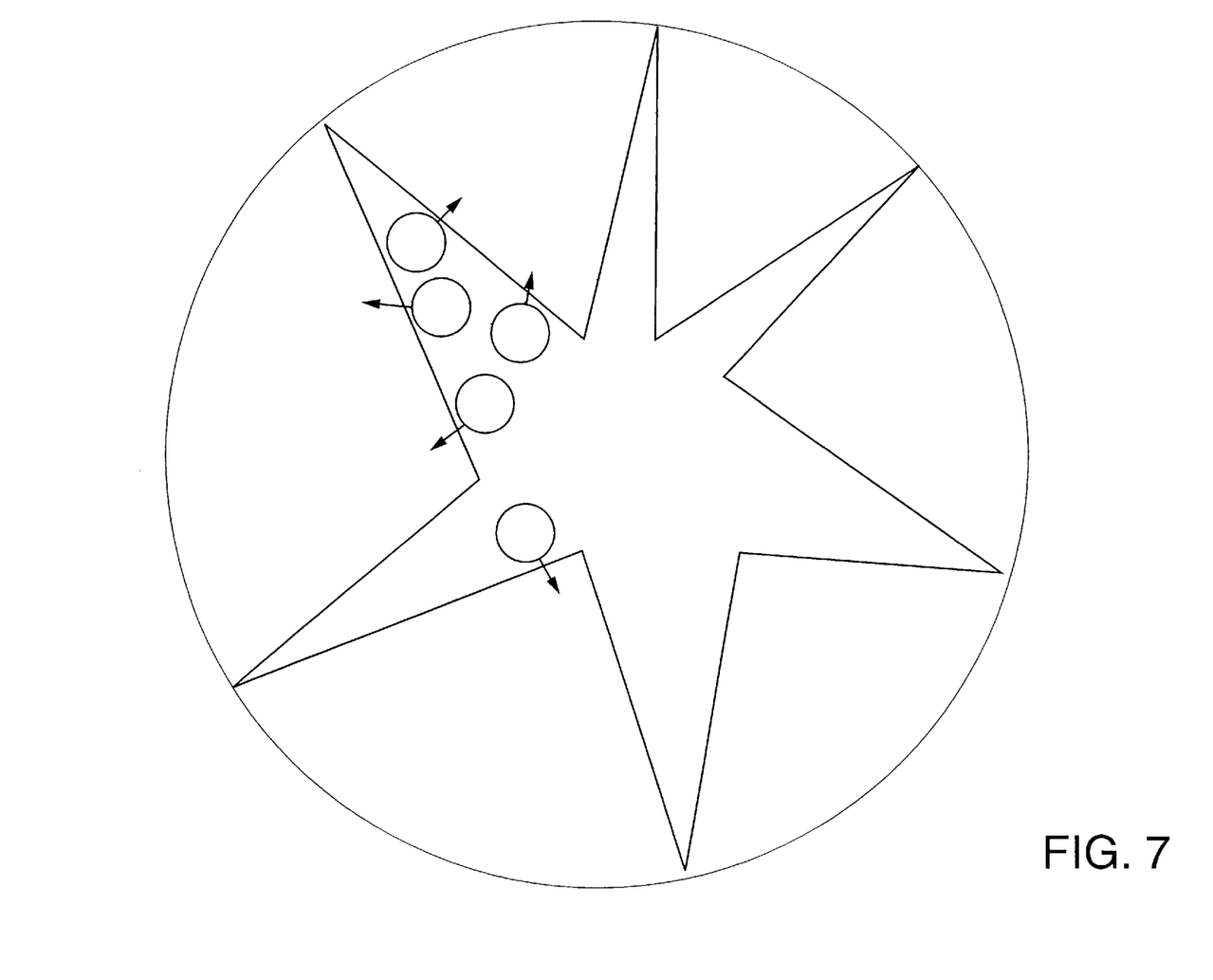
FIG. 7: Schematic top view of wafer holder depicting partial arrangement of chucks as typically used to support irregularly-shaped workpiece.

FIG. 7 depicts an embodiment of the present invention as typically used for irregularly-shaped workpieces. The guidelines provided herein still apply: Peripheral chucks are located as close together as feasible and sufficiently close to the edge to avoid cantilever distortion, have overlapping gas jets directed towards the periphery of the holder; Interior chucks have gas jets directed to gaps between adjacent chucks and generally in the direction of the periphery of the workpiece.

Having described the invention in detail, those skilled in the art will appreciate that, given the present disclosure, modifications may be made to the invention without departing from the spirit of the inventive concept described herein. Therefore, it is not intended that the scope of the invention be limited to the specific and preferred embodiments illustrated and described. Rather, it is intended that the scope of the invention be determined by the appended claims.

We claim:

1. A wafer holder comprising a plurality of vortex chucks in a substantially planar array and a substantially flat surface between said chucks substantially coplanar with the open end of the vortex chambers of said chucks.

2. A wafer holder as in claim 1 wherein the separation between centers of adjacent vortex chucks does not exceed approximately 50 mm.

3. A wafer holder as in claim 1 wherein said chucks have orientation such that the preferential exit of gas from each of said chucks is in a direction substantially towards the periphery of said wafer holder.

4. A wafer holder as in claim 3 wherein said preferential exit of gas from each of the chucks located on the periphery of said wafer holder overlaps the exit gas from adjacent chucks located on the periphery.

5. A wafer holder as in claim 3 wherein said preferential exit of gas from each of the chucks not located on the periphery of said wafer holder is in a direction substantially between adjacent chucks.

6. A wafer holder as in claim 5 wherein said overlap of exit gas occurs at approximately 50% of the maximum flow intensity.

7. A wafer holder as in claim 1 wherein the spacing between adjacent chucks on the periphery of said wafer holder is less than the spacing between adjacent chucks not on said periphery.

8. A wafer holder as in claim 1 further comprising a common supply of gas connected to each of said chucks.

9. A wafer holder as in claim 8 wherein the diameters of the gas inlet orifices of chucks located on the periphery of said wafer holder exceeds the orifice diameters of chucks not located on said periphery.

10. A wafer holder as in claim 1 further comprising a plurality of radial grooves in said flat surface.

11. A wafer holder as in claim 10 wherein said grooves have a width from approximately 0.25 mm to approximately 1.00 mm.

12. A wafer holder as in claim 10 wherein said grooves have a depth from approximately 0.08 mm to approximately 0.25 mm.

13. A wafer holder as in claim 1 further comprising a spring holding each of said chucks against said flat surface forming thereby a seal substantially impervious to gas flow around the periphery of each of said chucks.

* * * * *